United States Patent [19]

Smolley

[11] Patent Number: 5,007,843

[45] Date of Patent: Apr. 16, 1991

[54] HIGH-DENSITY CONTACT AREA ELECTRICAL CONNECTORS

[75] Inventor: Robert Smolley, Porteuguese Bend, Calif.

[73] Assignee: TRW Inc., Redondo Beach, Calif.

[21] Appl. No.: 26,327

[22] Filed: Mar. 16, 1987

Related U.S. Application Data

[63] Continuation-in-part of Ser. No. 835,818, Mar. 8, 1986, which is a continuation-in-part of Ser. No. 499,137, May 31, 1983, abandoned, and Ser. No. 499,136, May 31, 1983, Pat. No. 4,574,331, and Ser. No. 737,631, May 24, 1985, Pat. No. 4,581,679.

[51] Int. Cl.$^5$ .............................................. H01R 9/09
[52] U.S. Cl. ........................................ 439/66; 439/591
[58] Field of Search ................... 439/329, 66, 91, 289, 439/591

[56] References Cited

U.S. PATENT DOCUMENTS

| | | | |
|---|---|---|---|
| 2,663,753 | 12/1953 | Bird | 174/88 C |
| 3,324,445 | 6/1967 | Miller | 439/329 |
| 3,327,278 | 6/1967 | Godel | |
| 3,904,934 | 9/1975 | Martin | |
| 3,994,552 | 11/1976 | Selvin | 439/287 |
| 4,420,767 | 12/1983 | Hodge et al. | 357/891 |
| 4,612,602 | 9/1986 | Weyer et al. | 361/413 |

OTHER PUBLICATIONS

Tecknit, Conductive Elastomeric Connector, Data Sheet CEC-011, 7-1974, Technical Wire Products Inc.

*Primary Examiner*—Neil Abrams
*Attorney, Agent, or Firm*—James M. Steinberger; Ronald L. Taylor

[57] ABSTRACT

An improved electrical connector for making electrical connections between electronic components. The improved electrical connector includes an insulating board interposed between metalized contact areas on the electronic components. The insulating board has openings at positions corresponding to the contact areas of the electronic components, with electrical connections between the contact areas established with conductive connector elements positioned in the openings of the insulating board. The connector elements are preferably each formed from a strand of metal wire, each strand being wadded together to form a nearly cylindrical "button" of material having a density of between twenty and thirty percent. The improved electrical connector provides high density contact areas, easy engagement and disengagement of the electronic components, and minimum electrical resistance between the contact areas.

12 Claims, 3 Drawing Sheets

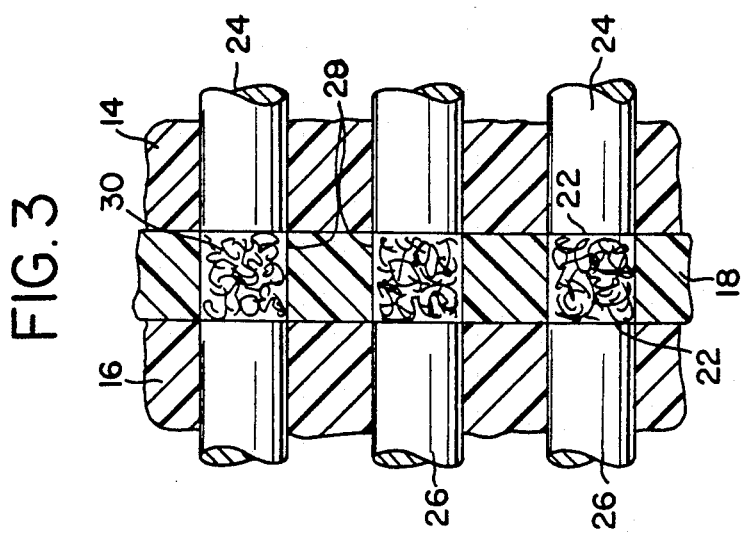
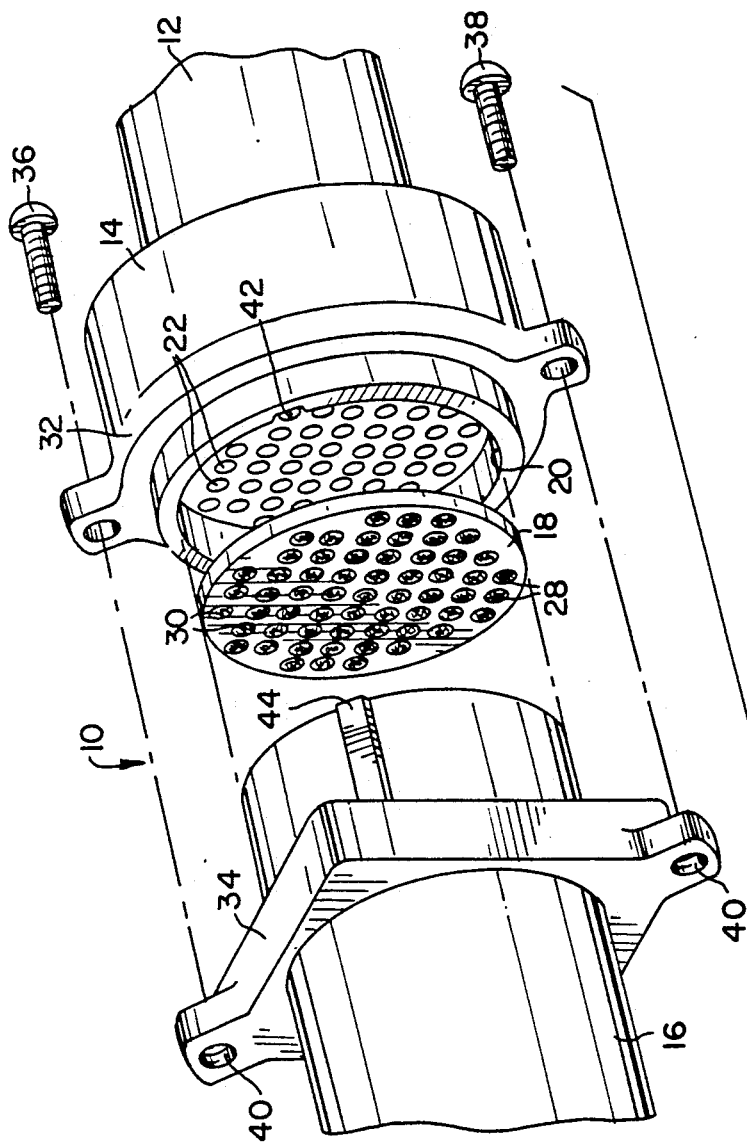
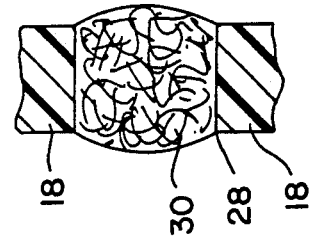

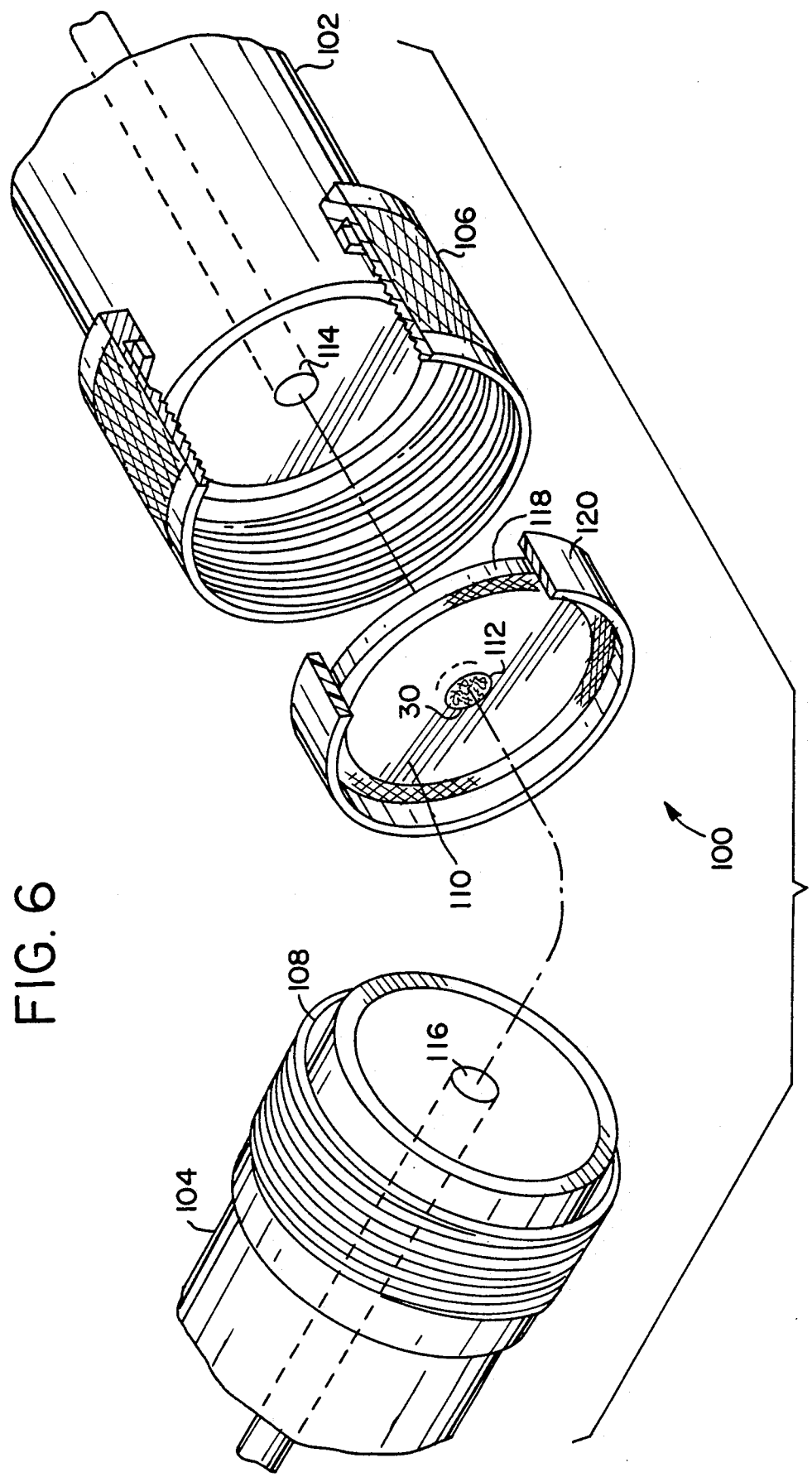

HIGH-DENSITY CONTACT AREA ELECTRICAL CONNECTORS

This application is a continuation of a copending application by the same inventor entitled "Integrated-Circuit Chip Interconnection System," Ser. No. 835,818, and filed on Mar. 8, 1986. The Ser. No. 835,818 application is in turn a continuation-in-part of two applications by the same inventor entitled "Button Board Chip Interconnection System," Ser. No. 499,137, filed on May 31, 1983, and subsequently abandoned in favor of the Ser. No. 835,818 application and "Multi-Element Circuit Construction," Ser. No. 499,136, filed on May 31, 1983, which issued as U.S. Pat. No. 4,574,331 on Mar. 3, 1986 and Ser. No. 737,631 filed on May 24, 1985, which issued as U.S. Pat. No. 4,581,679 on Apr. 8, 1986. This application is also related to an earlier-filed application by the same inventor entitled "Multilayer Circuit Board Interconnection," Ser. No. 482,372, filed on Aug. 25, 1965, and subsequently abandoned.

BACKGROUND OF THE INVENTION

This invention relates generally to electrical connectors and, more particularly, to electrical connectors having reliable, high density contact areas.

Electrical connectors allow large electronic systems and subsystems to be assembled from many smaller electronic components, such as circuit boards, thus simplifying the manufacture, installation and maintenance of the electronic systems and subsystems. Typically, the circuit boards in these electronic systems and subsystems are interconnected with each other by means of a "mother" board, a large circuit board having edge card connectors into which the circuit boards are plugged. Alternatively, the circuit boards are interconnected by means of these same edge card connectors, but with cable harnesses and cable harness connectors in place of the mother board.

Conventional edge card connectors generally utilize leaf-spring contacts for engaging contact areas at the edges of the circuit boards. Although these types of edge card connectors have many advantages, they do have some disadvantages. One disadvantage is that leaf-spring contacts can become bent and fail to make contact with the circuit board contact areas. Another disadvantage is that leaf-spring contacts have a relatively high electrical resistance. Still another disadvantage is that a comparatively high force is required to engage and disengage the circuit board from the edge card connector. However, the most significant disadvantage is that the contact areas at the circuit board edge require relatively large surface areas, thus severely limiting the number of contacts areas that can be placed along the edge of the circuit board. Circuit boards presently being manufactured are limited to about 250 edge contact areas, but in the very near future, as integrated-circuit chips become more complex, circuit boards having in excess of 400 contact areas will be required.

Conventional cable harness connectors generally utilize male and female parts, such as pins and sockets, for connecting the leads of one cable harness to another. As with edge card connectors, cable harness connectors also have some disadvantages. One disadvantage is that the pins can become bent, thus preventing insertion of the pins into the sockets. Another disadvantage is that pins and sockets have relatively high electrical resistances. Still another disadvantage is that a comparatively high force is required to engage and disengage the cable harness connectors. However, the most significant disadvantage is that the pins and sockets require relatively large surface areas, thus severely limiting the number of contact areas that can be placed in one cable connector.

To obviate or minimize the disadvantages arising from the use of these conventional electrical connectors, it is apparent that a new approach for making electrical connections between electronic components is needed. The new approach should preferably minimize electrical contact resistance, provide easy engagement and disengagement of the electronic components and, most importantly, provide high density contact areas. The present invention is directed to these ends.

SUMMARY OF THE INVENTION

The present invention resides in an improved electrical connector for making electrical connections between electronic components. Briefly, and in general terms, the improved electrical connector includes an insulating board interposed between metalized contact areas on the electronic components. The insulating board has one or more openings at positions corresponding to the contact areas of the electronic components, with electrical connections between the contact areas established with conductive connector elements positioned in the openings of the insulating board. The improved electrical connector provides high density contact areas, easy engagement and disengagement of the electronic components, and minimum electrical resistance between the contact areas.

In a presently preferred embodiment of the invention, two cable harnesses are electrically connected by a cable harness connector using the technique of the present invention. The cable harness connector includes a first and second connector housing and an insulating board interposed between the two connector housings. The faces of the first and second connector housings have a plurality of metalized contact areas for connecting the leads of the two cable harnesses. The insulating board has a plurality of circular openings at positions corresponding to the connector housing contact areas. Compressing the connector housings together causes conductive connector elements positioned in the openings to be compressed against the metalized contact areas, thus making electrical connections between the contact areas.

In another presently preferred embodiment of the invention, a circuit board and a mother board, and a circuit board and a cable harness, are electrically connected by an edge card connector using the technique of the present invention. The edge card connector includes a connector housing, an insulating board interposed between the connector housing and the circuit board, and another insulating board interposed between the connector housing and the mother board or between the connector housing and the cable harness. The first insulating board fits within a recessed area of the connector housing, with the recessed area having a plurality of metalized contact areas for connecting leads in the connector housing with a plurality of metalized contact areas along the edge of the circuit board. The bottom face of the connector housing has a plurality of metalized contact areas for connecting the leads in the connector housing with a plurality of metalized contact areas on the mother board or on the face of a cable harness connector housing attached to the cable harness. The insulating boards have a plurality of circular openings at positions corresponding to the contact areas of the connector housing, the circuit board and the mother board or cable harness connector housing. Compressing the connector housing, the circuit board and the mother board or cable harness together causes conductive connector elements positioned in the openings to be compressed against the metalized contact areas, thus making electrical connections between the contact areas.

In still another presently preferred embodiment of the invention, two coaxial cables are electrically connected by a coaxial cable connector using the technique of the present invention. The coaxial cable connector is similar to the cable harness connector, with the exception that the coaxial cable connector has only a single conductive connector element in a circular opening at the center of the insulating board to electrically connect the center conductors of the two coaxial cables. An annular-shaped woven wire mesh, positioned about the circumference of the insulating board, electrically connects the outer conductors of the two coaxial cables.

The conductive connector elements are preferably each formed from a strand of metal wire, each strand being wadded together to form a nearly cylindrical "button" of material having a density of between twenty and thirty percent. Each wadded-wire connector element fits snugly in an opening of the insulating board and protrudes slightly above and below the insulating board. The wadded-wire connector elements make electrical contact at multiple points when compressed against a contact area. Connectors of this type have significant advantages over other types of connectors, and provide connections of high integrity and reliability. In contrast to the other types of connectors, this mechanical connector element has very few associated variables that can affect the quality of the connection. The only significant variables are the size of the connector element and the compressive force used to make the connection, both of which can be accurately controlled.

It will be appreciated from the foregoing that the present invention represents a significant advance in the techniques of electrically connecting electronic components. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 1 is a fragmentary perspective view of a cable harness connector using the technique of the present invention;

FIG. 2 is a fragmentary, exploded view of a wadded-wire connector element;

FIG. 3 is a fragmentary, exploded sectional view of an insulating board with a plurality of wadded-wire connector elements;

FIG. 6 is a fragmentary perspective view of a coaxial cable connector using the technique of the present invention.

DESCRIPTION OF THE PREFERRED EMBODIMENTS

Figure 5:
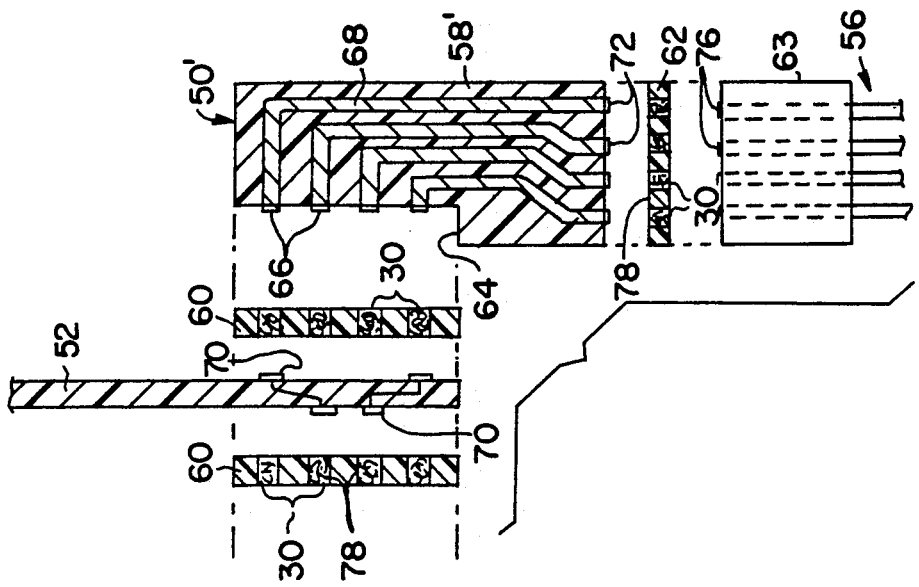
FIG. 5 is a fragmentary sectional view of an edge card connector using the technique of the present invention for electrically connecting a circuit board and a cable harness.

As shown in the drawings for purposes of illustration, the present invention is embodied in an improved electrical connector for making electrical connections between electronic components. In large electronic systems and subsystems, circuit boards are typically interconnected with each other by means of a "mother" board, a large circuit board having edge card connectors into which the circuit boards are plugged. Alternatively, the circuit boards can be interconnected by means of these same edge card connectors, but with cable harnesses and cable harness connectors in place of the mother board. However, conventional edge card and cable harness connectors have relatively high electrical resistances, are not easily engaged and disengaged and, most importantly, require relatively large surface areas for making the electrical connections.

In accordance with the present invention, the improved electrical connector includes an insulating board interposed between metalized contact areas on the electronic components. The insulating board has one or more openings at positions corresponding to the contact areas of the electronic components, with electrical connections between the contact areas established with conductive connector elements positioned in the openings of the insulating board. In a presently preferred embodiment of the invention, two cable harnesses are electrically connected by a cable harness connector using the technique of the present invention. In another presently preferred embodiment of the invention, a circuit board and a mother board, and a circuit board and a cable harness, are electrically connected by an edge card connector using the technique of the present invention. In still another presently preferred embodiment of the invention, two coaxial cables are electrically connected by a coaxial cable connector using the technique of the present invention. These improved electrical connectors provide high density contact areas, easy engagement and disengagement of the electronic components, and minimum electrical resistance between the contact areas.

FIG. 1 shows a cable harness connector 10 for making electrical connections between a first cable harness 12 and a second cable harness (not shown). The cable harness connector 10 includes a first connector housing 14, a second connector housing 16 and a circular insulating board 18 interposed between the two connector housings 14, 16. The insulating board 18, commonly referred to as a button board, fits within a recessed area 20 of the first connector housing 14. The faces of the first and second connector housings 14, 16 have a plurality of metalized contact areas 22 for connecting leads 24 of cable harness 12 to leads 26 of the other cable harness.

As shown more clearly in FIG. 3, the insulating board 18 has a plurality of circular openings 28 at positions corresponding to the connector housing contact areas 22. Electrical connections between the contact areas 22 are established with connector elements 30 positioned in the openings 28 of the insulating board 18. Compressing the two connector housings 14, 16 together causes the connector elements 30 to be compressed against the metalized contact areas 22. Compression is provided by a flange 32 around the outer circumference of the first connector housing 14, a flange 34 around the outer circumference of the second connector housing 16 and two bolts 36, 38. The bolts 36, 38 engage a pair of threaded holes 40 in the flange 34. A slot 42 in the first connector housing 14 engages a key 44 protruding outwardly from the outer surface of the second connector housing 16, thus ensuring proper alignment of the contact areas 22 and the connector elements 30.

The insulating or button board 18 is preferably formed from an insulating material, such as a glass ceramic or a plastic. The connector elements 30 employed in the illustrative embodiments are preferably each formed from a strand of metal wire, each strand being wadded together to form a nearly cylindrical "button" of material having a density of between twenty and thirty percent. As shown in FIG. 2, each wadded-wire connector element 30 fits snugly in the opening 28 of the insulating board 18 and protrudes slightly above and below the insulating board 18. The wadded-wire connector elements 30 make electrical contact at multiple points when compressed against a contact area. Connectors of this type have significant advantages over other types of connectors and provide connections of high integrity and reliability. In contrast to the other types of connections, this mechanical connector element has very few associated variables that can affect the quality of the connection. The only significant variables are the size of the connector element and the compressive force used to make the connection, both of which can be accurately controlled.

The wadded-wire connector elements 30 employed in the illustrative embodiments can be fabricated using nickel wire, or wire made from such alloys as beryllium and copper, silver and copper, or phosphorus and bronze. The compression of the wadded-wire connector elements 30 is substantially elastic so that, when the compressive force of the flanges 32, 34 and bolts 36, 38 is removed, the wadded-wire connector elements 30 return to their original shape. This allows the cable harness connector 10 to be taken apart and put back together as many times as is needed. In the embodiments described, the wadded-wire connector elements 30 are manufactured by Technical Wire Products, Inc. of Piscataway, N.J., under the trademark Fuzz Button.

Figure 4:
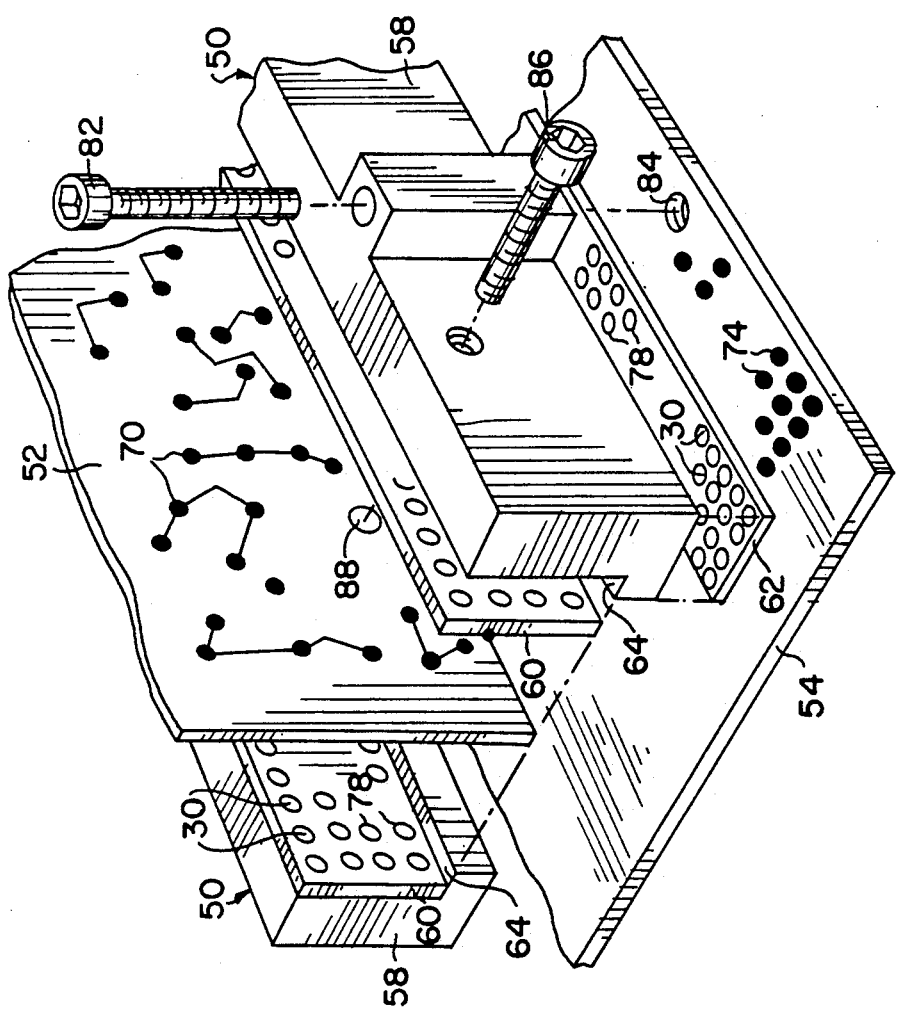
FIG. 4 is a fragmentary perspective view of an edge card connector using the technique of the present invention for electrically connecting a circuit board and a mother board.

FIG. 4 shows an edge card connector 50 for making electrical connections between a circuit board 52 and a mother board 54 and FIG. 5 shows an edge card connector 50' for making electrical connections between the circuit board 52 and a cable harness 56. The edge card connector 50 includes a connector housing 58, an insulating board 60 interposed between the connector housing 58 and the circuit board 52, and an insulating board 62 interposed between the connector housing 58 and the mother board 54. The edge card connector 50' includes a connector housing 58', an insulating board 60 interposed between the connector housing 58' and the circuit board 52, and an insulating board 62 interposed between the connector housing 58' and a cable harness connector housing 63. Each of the insulating boards 60 fits within a recessed area 64 of the connector housings 58, 58'.

As shown in FIG. 5, the recessed area 64 of each of the connector housings 58, 58' has a plurality of metalized contact areas 66 for connecting leads 68 in the connector housings 58, 58' with a plurality of metalized contact areas 70 along the edge of the circuit board 52.

The bottom faces of the connector housings 58, 58' have a plurality of metalized contact areas 72 for connecting the leads 68 in connector housings 58, 58' with a plurality of metalized contact areas 74 on the mother board 54 and a plurality of metalized contact areas 76 on the face of the cable harness connector housing 63, respectively. Each of the insulating boards 60 has a plurality of circular openings 78 at positions corresponding to the contact areas 66 of the connector housings 58, 58' and the contact areas 70 of the circuit board 52, while each of the insulating boards 62 has a plurality of openings 78 at positions corresponding to the contact areas 72 of the connector housings 58, 58' and the contact areas 74 of the mother board 54 and the contact areas 76 of the cable harness connector housing 63, respectively.

Electrical connections between the contact areas 70 of the circuit board 52 and the contact areas 66 of the connector housings 58, 58' and between the contact areas 72 of the connector housings 58, 58' and the contact areas 74, 76 of the mother board 54 and cable harness connector housing 63, respectively, are established with wadded-wire connector elements 30 positioned in the openings 78 of the insulating boards 60, 62. Compressing the connector housings 58, 58' and the circuit board 52 together causes the wadded-wire connector elements 30 to be compressed against the metalized contact areas 70, 66 and compressing the connector housings 58, 58' and the mother board 54 and cable harness 56 together, respectively, causes the wadded-wire connector elements 30 to be compressed against the metalized contact areas 72, 74, 76. Compression of the connector housing 58 and the mother board 54 is provided by a bolt 82 that engages a threaded hole 84 in the mother board 54 and compression of the connector housing 58 and the circuit board 52 is provided by a bolt 86 that engages a threaded hole 88 in the circuit board 52.

The circuit boards 52 employed in the illustrated embodiments preferably have four to six rows of contact areas 70 along each edge. The contact areas 70 are spaced on centers of between 0.030 to 0.040 inches, thereby providing approximately 800 contacts along each edge of a circuit board.

FIG. 6 shows a coaxial cable connector 100 for making electrical connections between a first coaxial cable 102 and a second coaxial cable 104. The coaxial cable connector 100 includes a connector housing 106 rotatably attached at the end of the first coaxial cable 102 and having a threaded inside surface, a collar 108 rigidly attached at the end of the second coaxial cable 104 and having a threaded outside surface for engagement with the threaded inside surface of the connector housing 106, and a circular insulating board 110 interposed between the ends of the two coaxial cables 102, 104. The insulating board 110 has a single circular opening 112 at its center, with a wadded-wire connector element 30 positioned in the opening 112 to electrically connect a center conductor 114 of the first coaxial cable 102 with a center conductor 116 of the second coaxial cable 104. An annular-shaped woven wire mesh 118, positioned about the circumference of the insulating board 110, electrically connects the outer conductors of the two coaxial cables 102, 104.

The insulating board 110, which in the presently preferred embodiment of the invention is fabricated from Teflon, fits within an alignment ring 120 that slips over the outer surfaces of the two coaxial cables 102, 104 to properly align the opening 112 with the center conductors of the two coaxial cables 102, 104. Compressing the two coaxial cables 102, 104 together by screwing the threaded connector housing 106 onto the threaded collar 108 causes the wadded-wire connector element 30 and the woven wire mesh 118 to be compressed against the ends of the center and outer conductors, respectively, thus making electrical connections between the center and outer conductors.

From the foregoing, it will be appreciated that the present invention represents a significant advance in the techniques for electrically connecting electronic components. Although several preferred embodiments of the invention have been shown and described, it will be apparent that other adaptations and modifications can be made without departing from the spirit and scope of the invention. Accordingly, the invention is not to be limited, except as by the following claims.

I claim:

1. An improved edge card connector for making electrical connections between an electronic component and a circuit board having edge contact areas, comprising:
    an edge card connector housing having a plurality of contact areas to which leads from the electronic component are connected;
    a first rigid insulating board disposed between the connector housing and the circuit board, the insulating board having a plurality of openings at positions corresponding to the connector housing contact areas and the circuit board contact areas;
    a plurality of conductive connector elements disposed in selected ones of the openings in the insulating board; and
    means for compressing the connector housing and the circuit board together, thereby compressing the connector elements and making electrical contact between the connector housing contract areas and the circuit board contact areas;
    wherein the connector housing includes:
        an edge card connector housing having a first plurality of contact areas for connecting leads in the connector housing to the circuit board contact areas and a second plurality of contact areas for connecting the leads in the connector housing to contact areas on the electronic component;
        a second rigid insulating board disposed between the connector housing and the electronic component, the insulating board having openings at positions corresponding to the connector housing contact areas and the electronic component contact areas;
        a plurality of conductive connector elements disposed in selected ones of the openings in the second insulating board; and
        means for compressing the connector housing and the electronic component together, thereby compressing the connector elements and making electrical contact between the connector housing contract areas and the electronic component contact areas.

2. The improved edge card connector as set forth in claim 1, wherein each of the connector elements includes:
    a wadded strand of conductive wire that is deformed when compressed and makes multiple electrical contacts with the connector housing contact areas and the electronic component contact areas.

3. The improved edge card connector as set forth in claim 2, wherein each wadded strand of wire has a density of approximately 20 to 30 percent.

4. The improved edge card connector as set forth in claim 2, wherein each wadded strand of wire is a nickel wire.

5. The improved edge card connector as set forth in claim 2, wherein each wadded strand of wire in an alloy wire, the alloy being selected from a group consisting of beryllium and copper, silver and copper, and phosphorus and bronze.

6. The improved edge card connector as set forth in claim 1, wherein the first and second insulating boards are fabricated from a glass ceramic or a plastic.

7. The improved edge card connector as set forth in claim 1, wherein each means for compressing includes a clamp mechanism.

8. An improved coaxial cable connector for making electrical connections between two coaxial cables, each coaxial cable having a center conductor and an outer conductor, comprising: a
    a connector housing attached to one of the coaxial cables;
    a rigid insulating board disposed between the ends of the two coaxial cables, the insulating board having an opening at a position corresponding to the center conductors of the two coaxial cables;
    a first conductive connector element disposed in the opening of the insulating board;
    a second conductive connector element disposed about the circumference of the insulating board; and
    means for compressing the connector housing and the two coaxial cables together, thereby compressing the connector elements and making electrical contact between the two center conductors and the two outer conductors.

9. The improved coaxial cable connector as set forth in claim 8, wherein the first conductive connector element includes:
    a wadded strand of conductive wire that is deformed when compressed and makes multiple electrical contacts with the ends of the two center conductors.

10. The improved coaxial cable connector as set forth in claim 8, wherein the second conductive connector element includes:
    an annular-shaped woven wire mesh that is deformed when compressed and makes multiple electrical contacts with the ends of the two outer conductors.

11. The improved coaxial cable connector as set forth in claim 9, wherein the wadded strand of wire has a density of approximately 20 to 30 percent.

12. The improved coaxial cable connector as set forth in claim 8, wherein the means for compressing includes a screw mechanism.

* * * * *